United States Patent
Mongia et al.

(10) Patent No.: US 7,193,316 B2
(45) Date of Patent: Mar. 20, 2007

(54) INTEGRATED CIRCUIT COOLANT MICROCHANNEL WITH MOVABLE PORTION

(75) Inventors: Rajiv K. Mongia, Portland, OR (US); Himanshu Pokharna, San Jose, CA (US); Eric DiStefano, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/014,592

(22) Filed: Dec. 16, 2004

(65) Prior Publication Data

US 2006/0131733 A1 Jun. 22, 2006

(51) Int. Cl.
*H01L 23/34* (2006.01)
*H05K 7/20* (2006.01)
*H01B 9/06* (2006.01)

(52) U.S. Cl. .............. 257/712; 257/713; 257/714; 257/716; 257/717; 257/E23.087; 257/E23.088; 257/E23.102; 361/688; 361/689; 174/15.1; 174/15.2; 174/17 R

(58) Field of Classification Search .............. None
See application file for complete search history.

(56) References Cited

U.S. PATENT DOCUMENTS

| 5,323,292 | A  | * | 6/1994  | Brzezinski ................. 361/689 |
| 6,279,337 | B1 | * | 8/2001  | Davidson et al. ........... 62/259.2 |
| 6,631,077 | B2 | * | 10/2003 | Zuo ........................... 361/699 |
| 6,679,315 | B2 | * | 1/2004  | Cosley et al. .............. 165/80.4 |
| 6,825,557 | B2 | * | 11/2004 | DiBattista et al. ........... 257/712 |
| 6,942,018 | B2 | * | 9/2005  | Goodson et al. ........... 165/80.4 |
| 6,986,382 | B2 | * | 1/2006  | Upadhya et al. ........... 165/80.4 |
| 6,992,382 | B2 | * | 1/2006  | Chrysler et al. ............ 257/717 |
| 6,994,151 | B2 | * | 2/2006  | Zhou et al. ................ 165/80.4 |
| 2004/0013545 | A1 | * | 1/2004 | Brown et al. ............. 417/413.3 |
| 2006/0071326 | A1 | * | 4/2006 | Chrysler et al. ............ 257/714 |

* cited by examiner

*Primary Examiner*—Jasmine Clark
(74) *Attorney, Agent, or Firm*—Buckley, Maschoff & Talwalkar LLC

(57) ABSTRACT

According to some embodiments, a microchannel is provided to transport a coolant. The microchannel may be proximate to an integrated circuit to transfer heat from the integrated circuit to the coolant. Moreover, a movable portion may be provided to adjust a volume of a space associated with the microchannel (e.g., when the coolant freezes).

34 Claims, 6 Drawing Sheets

INTEGRATED CIRCUIT COOLANT MICROCHANNEL WITH MOVABLE PORTION

BACKGROUND

As microprocessors advance in complexity and operating rate, the heat generated in microprocessors during operation increases and the demands on cooling systems for microprocessors also escalate. In some cases, circuit elements at a localized zone on the microprocessor die known as a "hotspot" may raise the temperature at that spot above the average temperature on the die. Thus, it may not be sufficient to keep the average temperature of the die below a target level, as excessive heating at hotspots may result in localized device malfunctions (even if the overall cooling target is met).

Moreover, it may be important that a microprocessor and cooling system be able to withstand cold temperatures (e.g., minus forty degrees Celsius). For example, a Personal Computer (PC) might be exposed to low temperatures while being shipped from a manufacturer, or a laptop computer might be exposed to freezing temperatures when stored in a person's car overnight.

DETAILED DESCRIPTION

Figure 1:
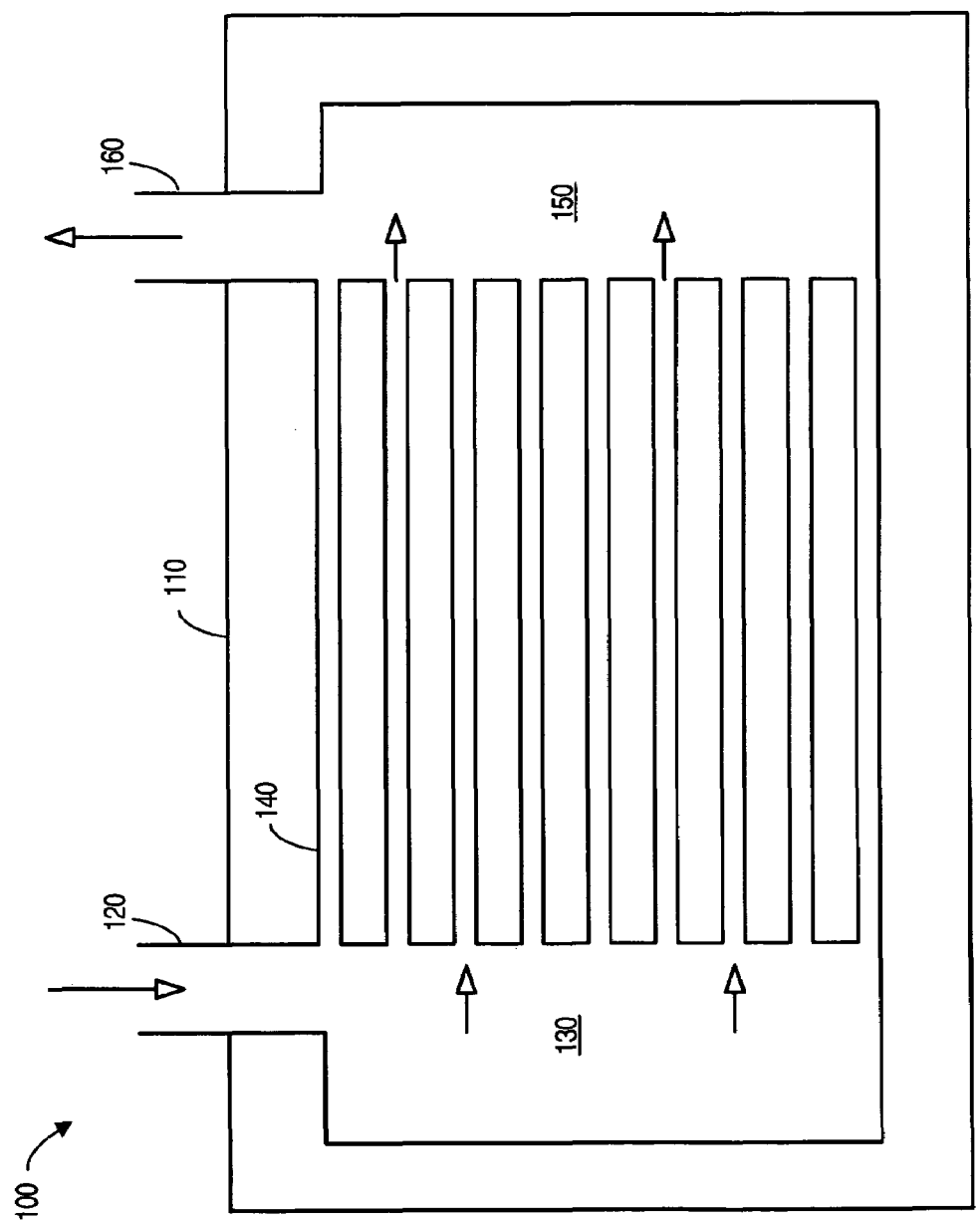
FIG. 1 is a block diagram of a system.

FIG. 1 is a block diagram of a system 100 including an Integrated Circuit (IC) 110. The IC 110 might be associated with, for example, an INTEL® PENTIUM IV processor. To help remove heat generated by the IC 110, a liquid coolant may be received in an inlet reservoir or chamber 130 through an inlet opening 120. For example, a pump might move the coolant through the inlet opening 120.

The inlet chamber 130 may comprise, for example, a manifold which opens into a number of channels 140 that lead to an outlet chamber 150 (e.g., another manifold). The coolant may flow through these channels 140 and then exit the outlet chamber 150 through an outlet opening 160. The channels 140 may be located proximate to the IC 110 to facilitate the removal of heat from the system 100. That is, heat may be transferred from the IC 110 to the coolant, which may then leave the system 100. The heated coolant might then cool at a remote location before returning to the system 100.

To efficiently facilitate a transfer of heat, a coolant with a relatively high thermal conductivity and high heat capacity may be used. Moreover, it may be beneficial if the coolant is relatively inexpensive and easy to pump. Note that water has a relatively high thermal conductivity, a relatively high heat capacity, is relatively inexpensive, and can be readily pumped. It may also be important that the system 100 be able to withstand cold temperatures (e.g., minus forty degrees Celsius). Note, however, that water expands in size when it freezes, and, as a result, the channels 140 or other portions of the system 100 may become damaged at cold temperatures. For example, the channels 140 might crack when water turns into ice.

Figure 2:
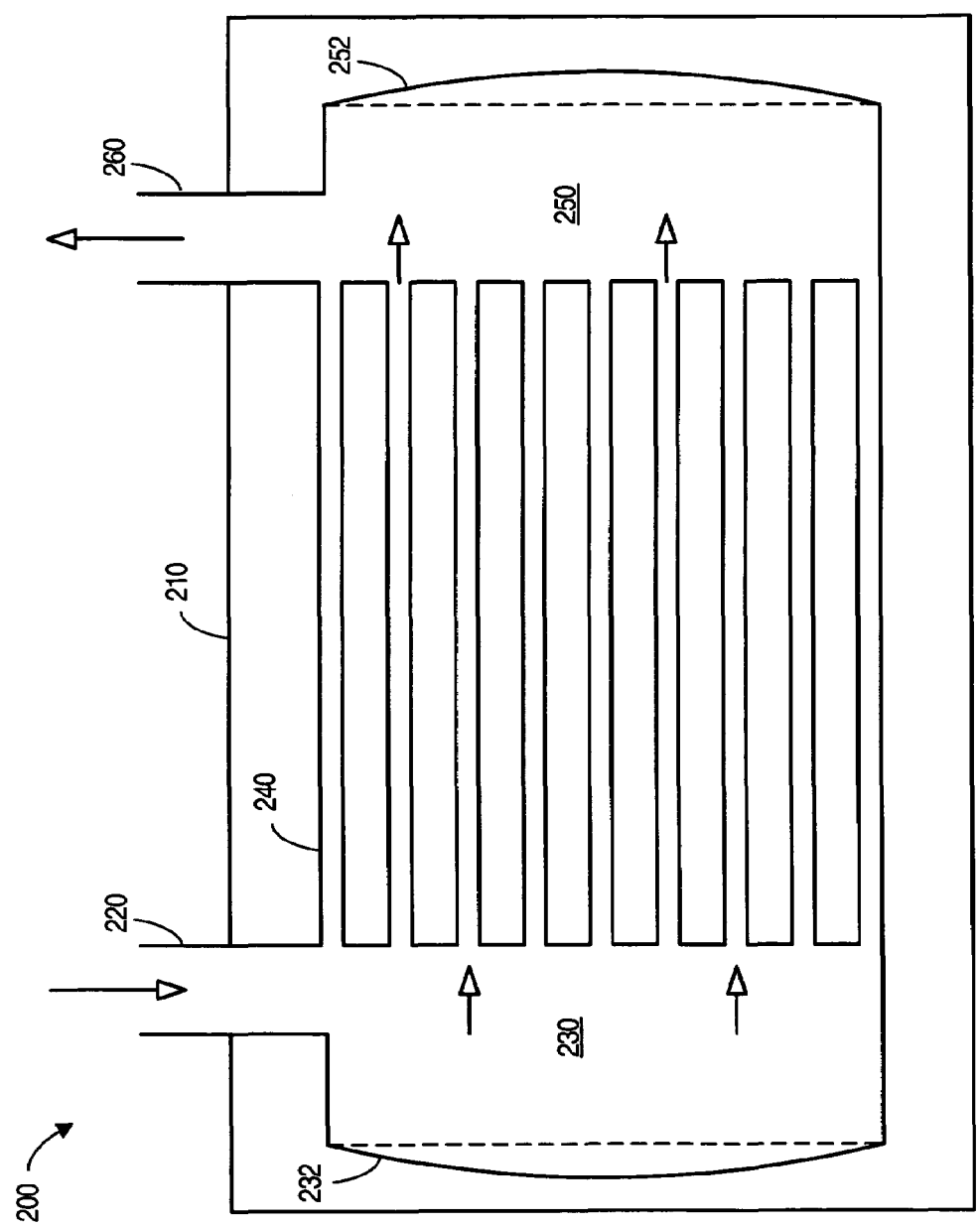
FIG. 2 is a block diagram of a system according to some embodiments.

FIG. 2 is a block diagram of a system 200 including an IC 210 according to some embodiments. As before, a liquid coolant is may be received in an inlet chamber 230 through an inlet opening 220. The coolant may then flow through a number of channels 240 to absorb heat generated by the IC 210. According to some embodiments, the channels 240 are "microchannels," such as passages each having a width of between twenty and five hundred micrometers. The microchannels could be provided, for example, in a cold plate that is located proximate to the IC 210. The coolant may then reach an outlet chamber 250 and exit the system 200 through an outlet opening 260. According to some embodiments, heat is dissipated from the coolant at a remote location and the coolant is then returned to the system 200 (e.g., a pumped loop might circulate the coolant through the system 200).

According to some embodiment, a movable portion is provided to adjust a volume of a space associated with a channel. For example, one or more walls 232 of the inlet chamber 230 might comprise a flexible membrane. In this case, the wall 232 may expand outward from an original position (increasing the size of the chamber 230) when water freezes. The wall 232 may then move back into the original position when the ice turns back into water. Thus, the likelihood of damage to the channels 240 and/or other elements of the system 200 may be reduced.

Although a particular wall 232 is illustrated in FIG. 2, note that any element of the system 200 might be used as a movable portion (e.g., the top or bottom walls, the ceiling, and/or the floor of the inlet chamber 230 illustrated in FIG. 2 might be movable). A similar type of flexible membrane could be used as a wall 252 of the outlet chamber 250 in addition to, or instead of, the wall 232 of the inlet chamber 230.

Note that the movable portion does not need to be flexible membrane. For example, a deformable metal sheet might act as a movable portion for the system 200 (e.g., a bimetallic strip formed of two different metals with different thermal expansion characteristics might be designed to bend outward when the temperature drops below freezing). As another approach, one of the walls might actually be a sliding plate that can be pushed outward when the coolant expands. In this case, a spring or a pneumatic device might push the plate back in when a coolant returns to liquid form. As another approach, part of the chamber 230 may be comprised of a porous and/or deformable material, such as a sponge, that may compress when the water around it freezes and expands. As used herein, the term "sponge" may refer to any material used as or in a channel that compresses when a liquid coolant freezes. According to some embodiments, it may be desirable that the system 200 be designed such that coolant does not leak (e.g., to preserve coolant and protect the IC 210).

Figure 3:
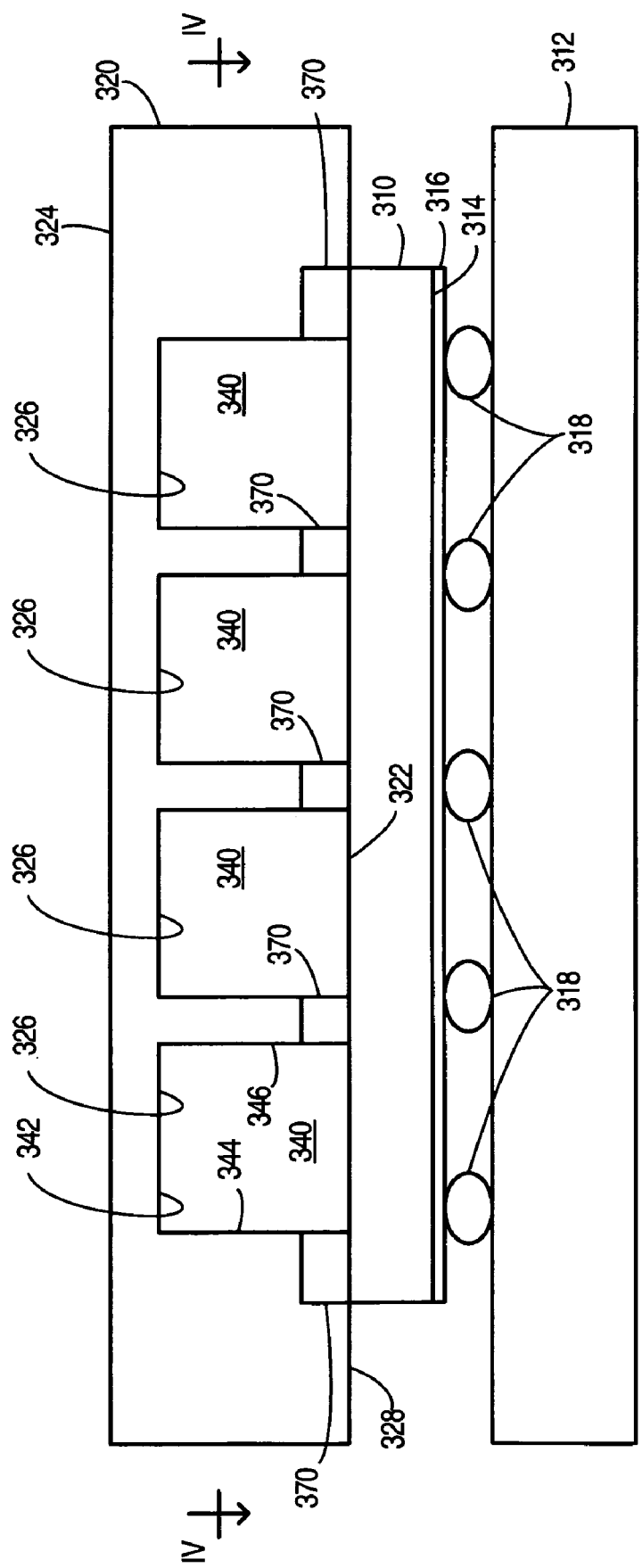
FIG. 3 is a partial schematic side cross-sectional view of an integrated circuit die with a portion of a cooling system and packaging for a die as provided according to some embodiments.

FIG. 3 is a partial schematic side cross-sectional view of an IC die 310 with a portion of a cooling system 320 and a die packaging substrate 312 as provided according to some embodiments. To simplify the drawing, various aspects of the die package are omitted.

Figure 4:
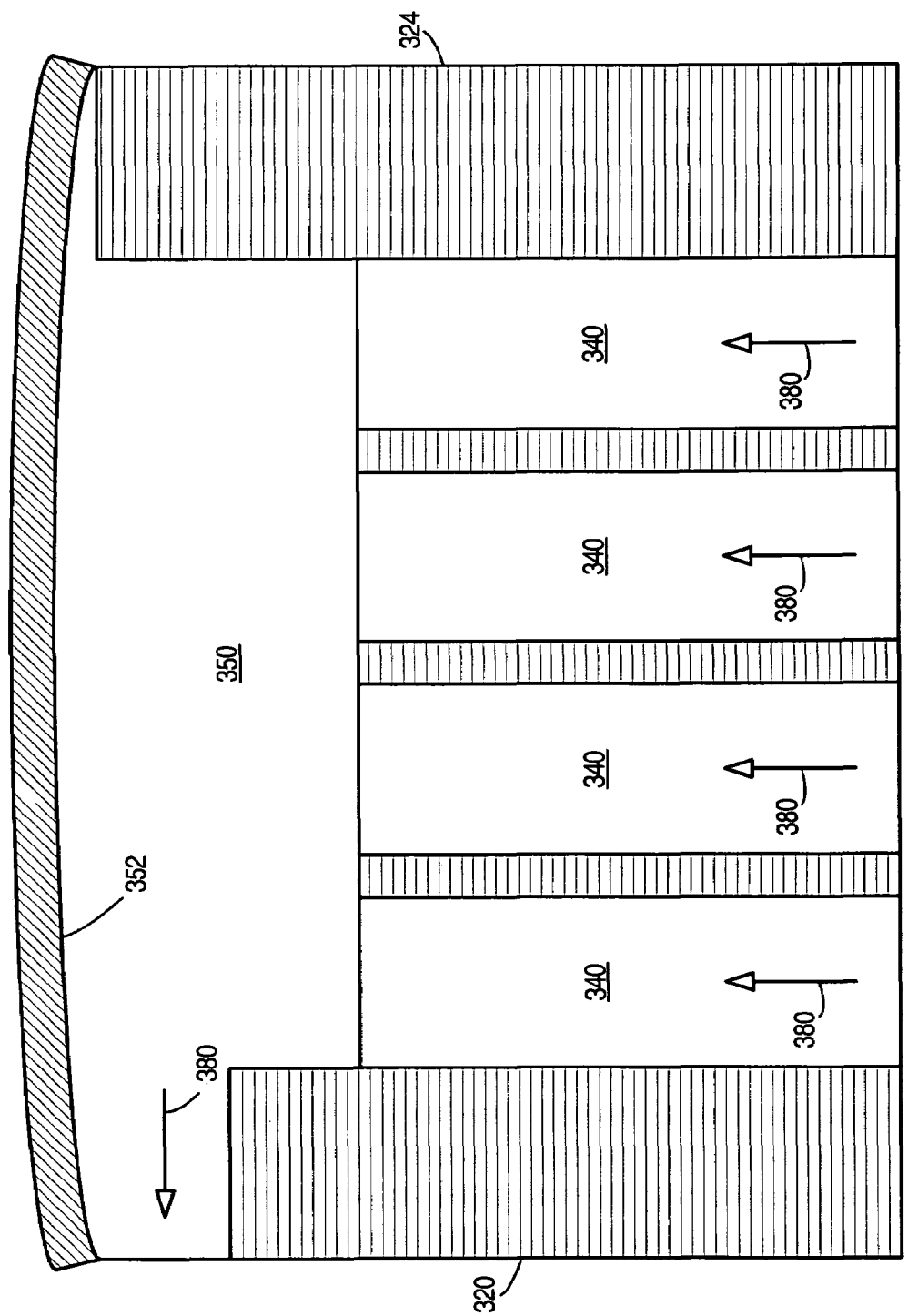
FIG. 4 is a partial schematic cross-sectional view from above, taken at line IV—IV in FIG. 3.

FIG. 4 is a partial schematic cross-sectional view of the IC die 310 and cooling system 320, taken in plan view at line IV—IV in FIG. 3. Both FIGS. 3 and 4 show simplified examples of the cooling system components, and in practice the layout of cooling system components may be much more complex than illustrated in the drawings. In general the drawings herein are not to scale.

Referring to FIG. 3, the IC die 310 is mounted on the package substrate 312 in a conventional "flip-chip" arrangement. The IC die 310 may be formed of a conventional semiconductor material such as silicon. The IC die 310 has front surface 314 on which an integrated circuit 316 (e.g., a microprocessor) is formed. The integrated circuit 316 is directly coupled to the package substrate 312 by die bumps 318 (note that traces, etc., present in the substrate 312, and to which the integrated circuit 316 is coupled by the die bumps 318, are not separately shown). The die bumps 318 may be more numerous than as depicted in FIG. 3.

The IC die 310 also has a rear surface 322 that is opposite the front surface 314. A microchannel member 324 is bonded to the rear surface 322 of the IC die 310 by bonding material 370. Grooves 326 are formed in the front side 328 of the microchannel member 324 to allow the microchannel member 324 to define microchannels 340. The front side 328 of the microchannel member 324 faces the rear surface 322 of the IC die 310. It will be noted that the grooves 326 of the microchannel member 324 define the microchannels 340 in cooperation with the rear surface 322 of the IC die 310, with the rear surface 322 forming the floors of the microchannels 340. In some embodiments, the grooves 326 may have a rectangular cross-section (as depicted in the drawing) so that the microchannels 340 also have a rectangular cross-section, but other shapes of cross-section are also possible. In some embodiments, the microchannels 340 may have a height (distance from rear surface 322 of the IC die 310 to the top wall 342 of the groove 28) of about 300 microns and a width (distance from one side wall 344 of the groove 326 to the other side wall 346 of the groove 28) of about 100 microns, but other dimensions of the microchannels 340 are possible. In a practical embodiment, the number of microchannels may be much more than the relatively few microchannels depicted in the drawing.

In some embodiments, the microchannel member 324 may be a heat spreader, such as an integrated heat spreader formed of copper or aluminum. In other embodiments, the member 324 may not be a heat spreader, but may still be formed of copper or aluminum, or alternatively of silicon. The grooves 326 may be formed in the member 324 by a lithographic process or by micro-machining. Bonding of the member 324 to the rear surface 322 of the IC die 310 may be with gold or solder or by another suitable technique such as thermal compression bonding. Noting again that the drawings are not to scale, the member 324 may be substantially thicker than the height of the microchannels 340, and the microchannels may be much narrower than suggested by the drawings. The microchannels 340 need not all be straight and parallel to each other.

The microchannels 340 are provided to allow a coolant (not shown) to flow through the microchannels 340. In some embodiments, the coolant may be de-ionized water. Flow of the coolant through the microchannels 340 is schematically represented by arrows 380 in FIG. 4.

Referring now to FIG. 4, the cooling system 320 also includes, in addition to the microchannels 340, an outlet chamber 350 such as a manifold into which coolant may flow from the microchannels 340. The outlet chamber 350 has a movable wall 352 that adjusts a volume of a space associated with the microchannels 340. For example, the wall 352 might be a deformable membrane that flexes away from the microchannels 340 when the coolant freezes (and thus increases the space in the outlet chamber 350). The movable wall 352, according to some embodiments, may be in a first position when the coolant is a liquid and in a second position when the coolant is a solid, the second position resulting in a larger space for the coolant as compared to the first position. By adjusting a volume associated with the outlet chamber 350 when the coolant changes from a liquid to a solid, the movable wall 352 may prevent damage to the microchannels 340 and other elements of the system.

Although a single layer of microchannels 340 is illustrated in FIGS. 3 and 4, according to some embodiments multiple layers of microchannels 340 (e.g., tiers) may be provided to facilitate a transfer of heat from the IC 310. Moreover, the cooling systems described herein, which include microchannels at and/or adjacent to the rear surface of the IC die, may be applicable both to conventional flip-chip mounted dies and other packages.

Figure 5:
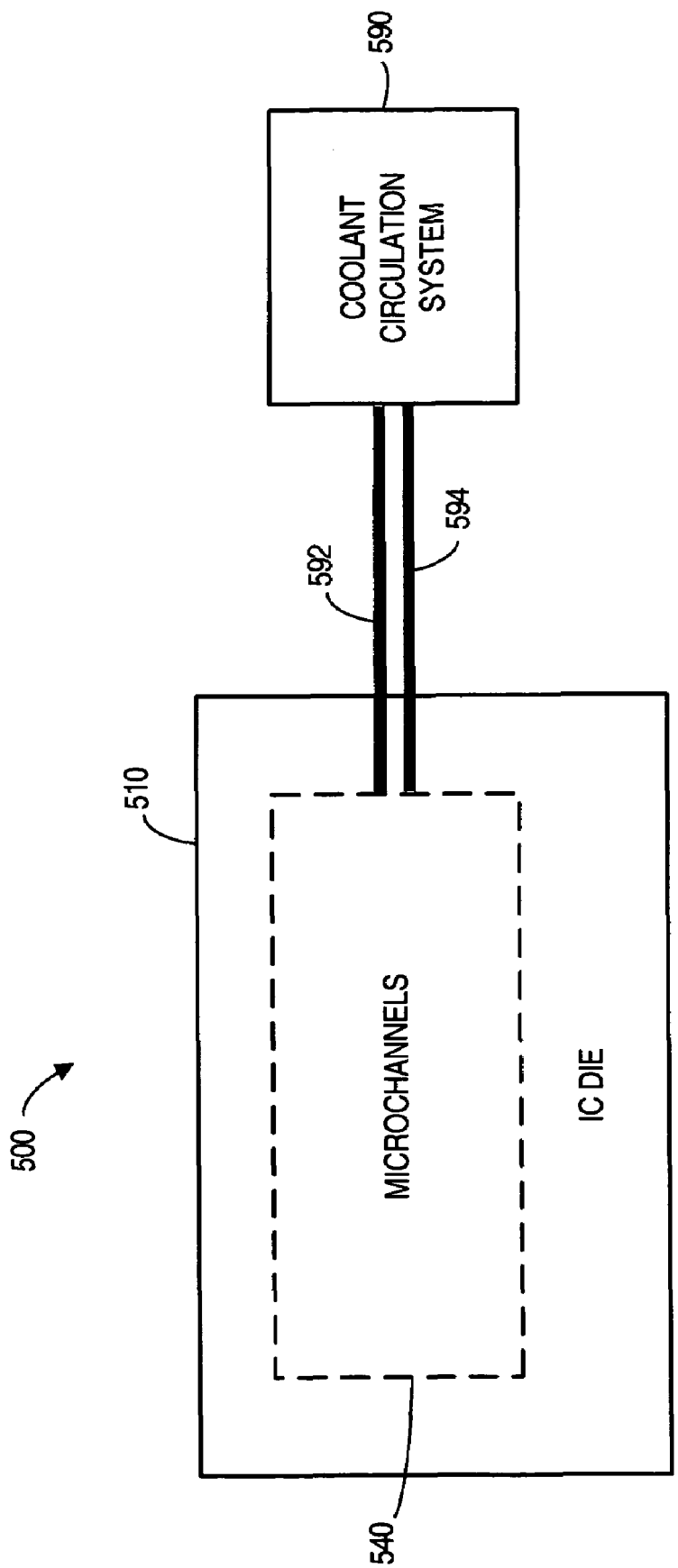
FIG. 5 is block diagram showing a die with additional components of a cooling system according to some embodiments.

FIG. 5 is a block diagram showing an IC die 510 and additional components of the cooling system 500. For purposes of illustration, the microchannels 340 are shown as a block in phantom. The cooling system 500 includes a coolant circulation system 590 to supply the coolant to the microchannels 540. The coolant circulation system 590 may be in fluid communication with the microchannels 540 via one or more coolant supply channels or lines 592 and one or more coolant return channels 594. Although not separately shown, a pump and a heat exchanger located remotely from the die 510 may be included in the coolant circulation system 590.

Coolant supplied by the coolant circulation system 590 may flow through the microchannels 540 at or above the rear surface of the IC die 510 to aid in cooling the IC die 510. In some embodiments, the coolant is operated with two phases—liquid and vapor. That is, in some embodiments at least part of the coolant in the microchannels 540 is in a gaseous state. In other embodiments, the coolant is single phase—that is, all liquid. In either case, a movable portion associated with the microchannels 540 may move when some or all of the coolant freezes.

Figure 6:
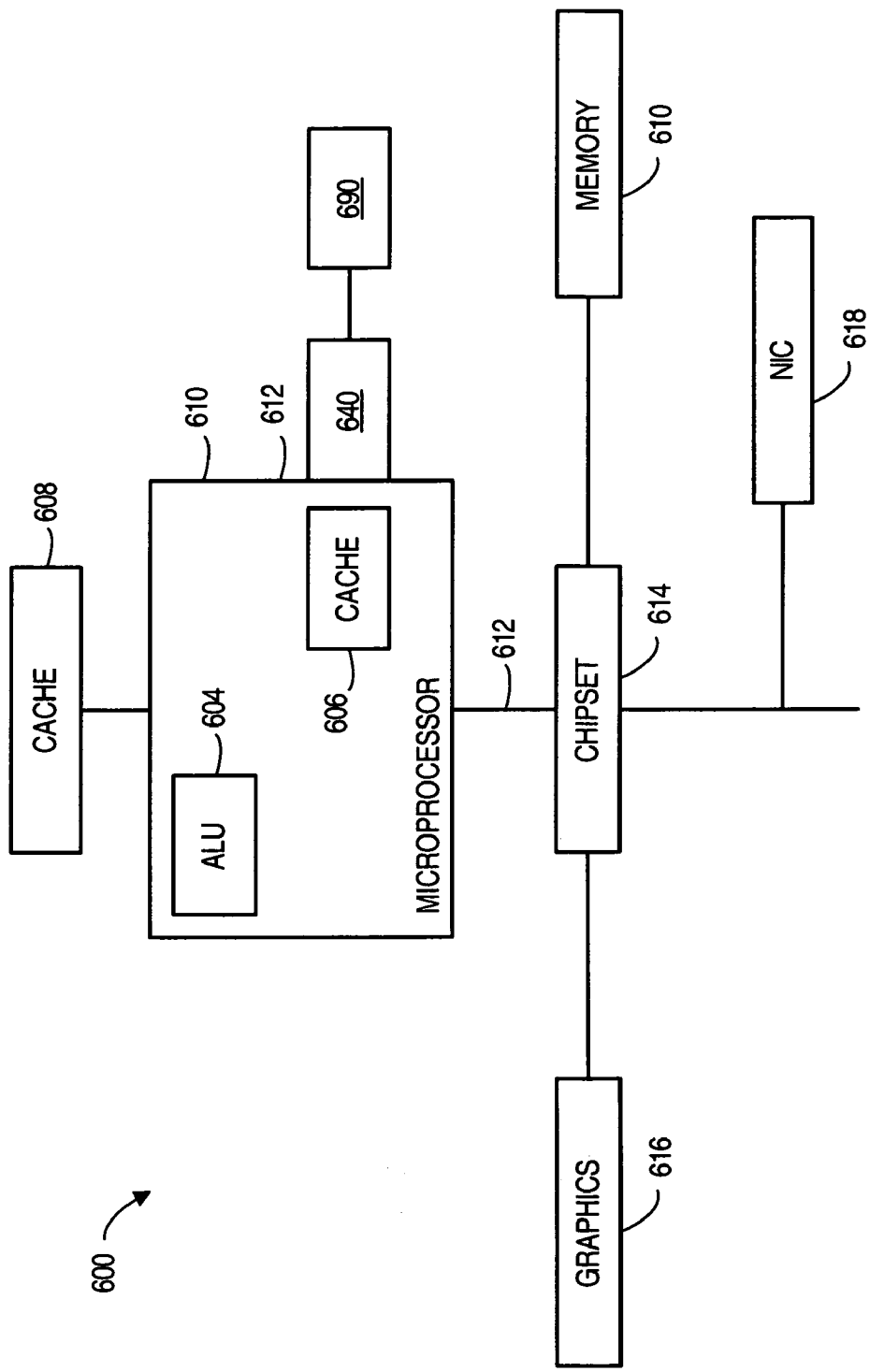
FIG. 6 is a block diagram of a computer system that includes an example of an integrated circuit die associated with a cooling system as in one or more of FIGS. 2–5 according to some embodiments.

The IC die 510 may be associated with a microprocessor in some embodiments. FIG. 6 is a block diagram of a system 600 in which such a die 610 may be incorporated. In particular, the die 610 includes many sub-blocks, such as an Arithmetic Logic Unit (ALU) 604 and an on-die cache 606. The microprocessor on die 610 may also communicate to other levels of cache, such as off-die cache 608. Higher memory hierarchy levels, such as system memory 610, may be accessed via a host bus 612 and a chipset 614. In addition, other off-die functional units, such as a graphics accelerator 616 and a Network Interface Controller (NIC) 618, to name just a few, may communicate with the microprocessor on die the 610 via appropriate busses or ports.

The IC die 610 may be cooled in accordance with any of the embodiments described herein. For example, a pump 690 may circulate a coolant (e.g., including water) through a cold plate 640 proximate to the IC die 610 and having at least one microchannel to transport the coolant. Moreover, a movable portion may be provided to adjust a volume of a space associated with the microchannel (e.g., when the water freezes).

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Although some embodiments have been described wherein water is used as a coolant, embodiments may be associated with any other type of coolant. Moreover, although particular movable portions and microchannel layouts have been described, embodiments may be associated with any other type of movable portion and/or channel layout. For example, coolant channels might be provided above and/or below an IC die or, in some cases, vertically through the IC die.

The several embodiments described herein are solely for the purpose of illustration. Persons skilled in the art will recognize from this description other embodiments may be practiced with modifications and alterations limited only by the claims.

What is claimed is:

1. An apparatus comprising:
   a microchannel to transport a coolant, the microchannel to be proximate to an integrated circuit to transfer heat from the integrated circuit to the coolant; and
   a movable portion to be moved by the coolant and thereby increase a volume of a space associated with the microchannel when the coolant freezes.

2. The apparatus of claim 1, wherein the movable portion comprises a flexible diaphragm.

3. The apparatus of claim 1, wherein the movable portion comprises at least one of: (i) a deformable material, or (ii) a sponge to compress when the coolant expands upon freezing.

4. The apparatus of claim 1, wherein a width associated with the microchannel is between 20 and 500 microns.

5. The apparatus of claim 1, wherein the microchannel is formed of at least one of: (i) copper, (ii) aluminum, or (iii) silicon.

6. The apparatus of claim 1, further comprising:
   a pump;
   a supply line to carry coolant from the pump to an inlet chamber; and
   a return line to carry coolant from an outlet chamber to the pump, wherein a plurality of microchannels run between the inlet chamber and the outlet chamber.

7. A system, comprising:
   a microprocessor integrated circuit die;
   at least one microchannel to transport a coolant, the at least one microchannel being proximate to the microprocessor integrated circuit die;
   a movable portion to be moved by the coolant and thereby adjust a volume of a space associated with the at least one microchannel; and
   a chipset in communication with the microprocessor integrated circuit die.

8. The system of claim 7, further comprising:
   a coolant circulation system to supply the coolant to the at least one microchannel.

9. The system of claim 7, wherein the coolant includes water.

10. The system of claim 7, wherein the system includes a plurality of microchannels, the space is associated with a manifold connecting to the microchannels, and the movable portion is a wall of the manifold.

11. The system of claim 7, wherein the coolant includes water and the movable portion is to adjust the volume of a chamber when the water freezes.

12. The system of claim 11, wherein the water is de-ionized.

13. The system of claim 7, wherein the movable portion comprises a flexible diaphragm.

14. The system of claim 7, wherein the movable portion comprises at least one of: (i) a deformable material, or (ii) a sponge to compress when the coolant expands upon freezing.

15. The system of claim 7, wherein the movable portion comprises a deformable metal sheet.

16. The system of claim 15, wherein the sheet is a bi-metallic strip.

17. The system of claim 7, wherein the movable portion comprises a sliding plate.

18. The system of claim 17, wherein the sliding plate is movable by at least one of: (i) a spring, or (ii) a pneumatic device.

19. The system of claim 7, wherein a width associated with the microchannel is between 20 and 500 microns.

20. The system of claim 7, wherein the microchannel is formed of at least one of: (i) copper, (ii) aluminum, or (iii) silicon.

21. The system of claim 7, further comprising:
   a pump;
   a supply line to carry coolant from the pump to an inlet chamber; and
   a return line to carry coolant from an outlet chamber to the pump, wherein a plurality of microchannels run between the inlet chamber and the outlet chamber.

22. An apparatus comprising:
   a microchannel to transport a coolant, the microchannel to be proximate to an integrated circuit to transfer heat from the integrated circuit to the coolant; and
   a passive volume adjusting surface associated with the microchannel, the adjusting surface being responsive to changes in coolant volume, wherein the adjusting surface moves in response to changes in coolant volume so as to increase a volume of a space associated with the microchannel when the coolant freezes.

23. An apparatus comprising:
   a plurality of microchannels to transport a coolant, the microchannels to be proximate to an integrated circuit to transfer heat from the integrated circuit to the coolant; and
   a manifold connecting the microchannels and defining a volume of space, including:
      a wall to be moved by the coolant and thereby adjust a volume of the space.

24. The apparatus of claim 23, wherein the movable portion comprises a flexible diaphragm.

25. The apparatus of claim 23, wherein a width associated with the microchannel is between 20 and 500 microns.

26. The apparatus of claim 23, wherein the microchannel is formed of at least one of: (i) copper, (ii) aluminum, or (iii) silicon.

27. An apparatus comprising:
   a microchannel to transport a coolant that includes water, the microchannel to be proximate to an integrated circuit to transfer heat from the integrated circuit to the coolant; and
   a movable portion to be moved by the coolant and thereby increase a volume of a chamber associated with the microchannel when the water freezes.

28. The apparatus of claim 27, wherein the water is de-ionized.

29. The apparatus of claim 27, wherein the movable portion comprises a flexible diaphragm.

30. The apparatus of claim 27, wherein the apparatus includes a plurality of microchannels, the chamber is associated with a manifold connecting to the microchannels, and the movable portion is a wall of the manifold.

31. An apparatus comprising:
a microchannel to transport a coolant, the microchannel to be proximate to an integrated circuit to transfer heat from the integrated circuit to the coolant; and
a deformable metal sheet to be moved by the coolant and thereby adjust increase a volume of a space associated with the microchannel when the coolant freezes.

32. The apparatus of claim 31, wherein the sheet is a bi-metallic strip.

33. An apparatus comprising:
a microchannel to transport a coolant, the microchannel to be proximate to an integrated circuit to transfer heat from the integrated circuit to the coolant; and
a sliding plate to be moved by the coolant and thereby increase a volume of a space associated with the microchannel when the coolant freezes.

34. The apparatus of claim 33, wherein the sliding plate is movable by at least one of: (i) a spring, or (ii) a pneumatic device.

* * * * *